US008680015B2

(12) United States Patent
Valcour, III et al.

(10) Patent No.: US 8,680,015 B2
(45) Date of Patent: Mar. 25, 2014

(54) MITIGATING THE EFFECTS OF DEFECTS IN HIGH TEMPERATURE SEMICONDUCTOR WIRES

(75) Inventors: Henry C. Valcour, III, Upton, MA (US); Peter D. Antaya, Sutton, MA (US); John Gannon, Sudbury, MA (US); Eric R. Podtburg, Natick, MA (US); Subramaniam Anandakugan, Acton, MA (US); William L. Carter, Chelmsford, MA (US); Hong Cai, Ayer, MA (US); Michael A. Tanner, Westborough, MA (US); David Crotzer, Merrimack, NH (US); Alexander Otto, Chelmsford, MA (US); Dana Krause, Waltham, MA (US)

(73) Assignee: American Superconductor Corporation, Devens, MA (US)

( * ) Notice: Subject to any disclaimer, the term of this patent is extended or adjusted under 35 U.S.C. 154(b) by 134 days.

(21) Appl. No.: 13/414,811

(22) Filed: Mar. 8, 2012

(65) Prior Publication Data
US 2012/0245035 A1      Sep. 27, 2012

Related U.S. Application Data

(60) Provisional application No. 61/454,811, filed on Mar. 21, 2011.

(51) Int. Cl.
*H01L 39/24* (2006.01)
(52) U.S. Cl.
USPC ........................................................ 505/237

(58) Field of Classification Search
USPC ......... 505/230–237; 428/699–701; 174/125.1
See application file for complete search history.

(56) References Cited

U.S. PATENT DOCUMENTS

| 5,583,319 | A  | * | 12/1996 | Lieurance ................... 174/84 R |
| 6,159,905 | A  | * | 12/2000 | Buzcek et al. ................ 505/234 |
| 7,071,148 | B1 | * | 7/2006  | Selvamanickam et al. ... 505/234 |
| 2009/0298696 | A1 | * | 12/2009 | Otto et al. ..................... 505/230 |
| 2010/0019776 | A1 | * | 1/2010  | Folts et al. .................... 324/539 |
| 2010/0022396 | A1 | * | 1/2010  | Otto et al. ..................... 505/231 |
| 2011/0010907 | A1 | * | 1/2011  | Bennett ...................... 29/402.09 |

FOREIGN PATENT DOCUMENTS

| DE | 3905424 | 8/1990 |
| WO | 2005/079220 | 9/2005 |
| WO | 2008/118127 | 10/2008 |

* cited by examiner

*Primary Examiner* — Colleen Dunn
(74) *Attorney, Agent, or Firm* — Occhiuti & Rohlicek LLP

(57) ABSTRACT

A method includes locating a defect in a first segment of high temperature superconducting wire. A second segment of high temperature superconducting wire is then positioned onto the first segment of high temperature superconducting wire such that the second segment of high temperature superconducting wire overlaps the defect. A path is then created such that current flows through the second segment of high temperature superconducting wire. The first segment of high temperature superconducting wire and second segment of high temperature superconducting wire are then laminated together.

7 Claims, 5 Drawing Sheets

400

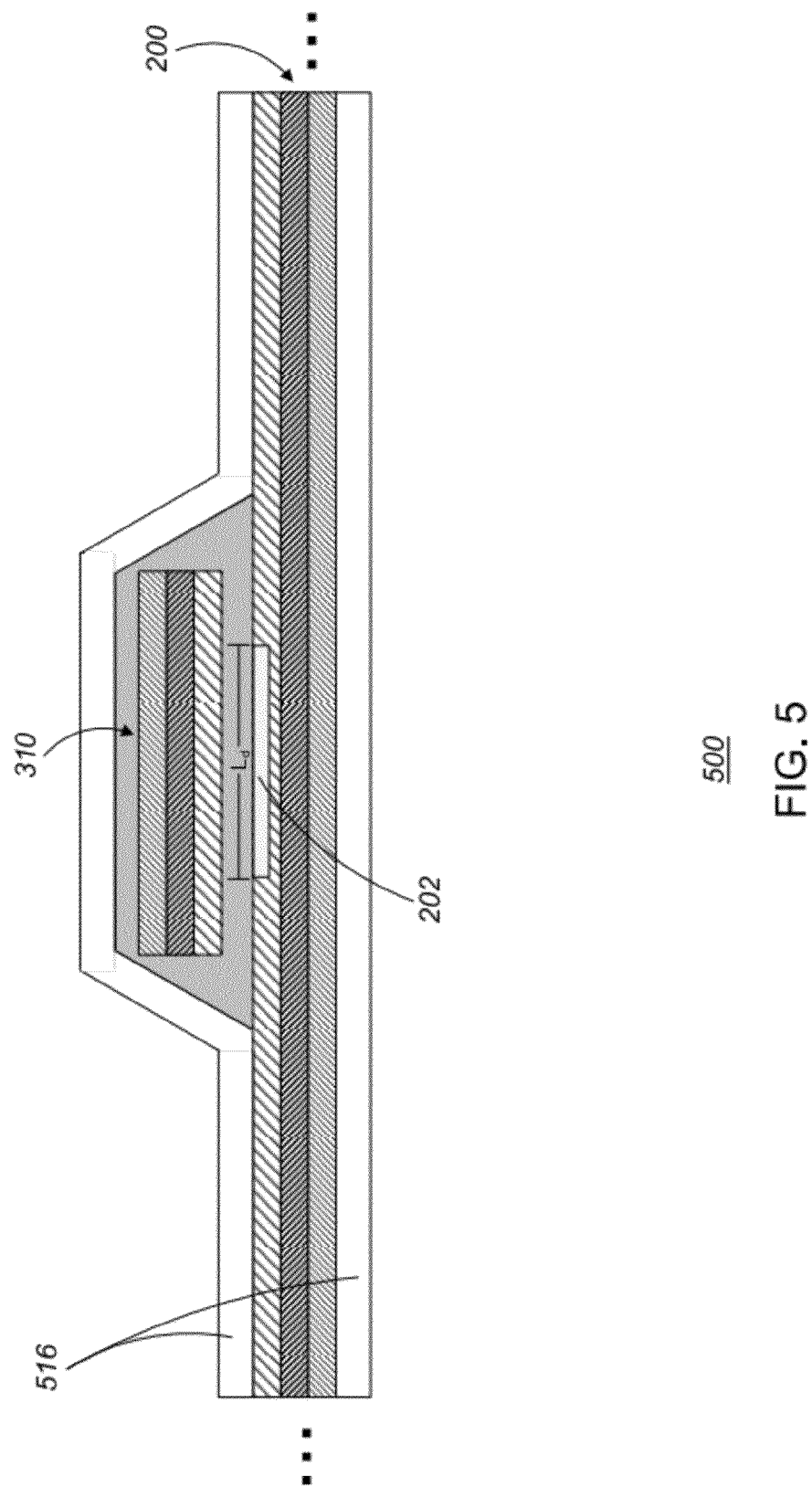

MITIGATING THE EFFECTS OF DEFECTS IN HIGH TEMPERATURE SEMICONDUCTOR WIRES

CROSS REFERENCE TO RELATED APPLICATIONS

This application claims priority to U.S. Provisional Application No. 61/454,811, filed on Mar. 21, 2011, the contents of which are incorporated herein by reference.

FIELD OF DISCLOSURE

This invention relates to mitigating the effects of defects in high temperature superconducting (HTS) wires.

BACKGROUND

High temperature superconductors are materials that, when cooled below a critical temperature, are capable of carrying extremely large currents with extremely low loss. The resistance to current flowing through such materials is extremely low. Under ideal conditions, the resistance to DC current is zero and the resistance to AC current is very close to zero.

The introduction of material defects into HTS wire during the HTS wire fabrication process is a common problem. A number of different types of defects occur, for example, fractures, dimples, or incorrect crystallographic orientation. The result of such defects is an undesirable increase in the overall resistance of the HTS wire.

Presently, defects are removed from HTS wire after the lamination process is complete. For example, a defective portion is first cut out of the laminated HTS wire, thus creating a physical disconnect in the wire. An "external splice" remedies this physical disconnect by overlapping the cut ends of the laminated HTS wire and bonding them together by, for example, a soldering process. This process is described in Otto et al., US Patent Application Publication No. US 2009/0298696 A1.

SUMMARY

In an aspect, the invention features a method including locating a defect in a first segment of high temperature superconducting wire and positioning a second segment of high temperature superconducting wire onto the first segment of high temperature superconducting wire such that the second segment of high temperature superconducting wire overlaps the defect. A path is then created such that current flows through the second segment of high temperature superconducting wire. The first segment of high temperature superconducting wire and second segment of high temperature superconducting wire are then laminated together.

Embodiments may include one or more of the following features. The step of creating the path may further include bonding the second segment of high temperature superconducting wire to the first segment of high temperature superconducting wire. Bonding the second segment of high temperature superconducting wire to the first segment of high temperature superconducting wire may be accomplished using low resistance solder.

The length of the portion of material that contains the defect may be determined. The second segment of high temperature superconducting wire may be formed to have a length greater than the length of the portion of material that contains the defect. The second segment of high temperature superconducting wire may span the portion of material that contains the defect. The second segment of high temperature superconducting wire may be formed to have a length less than or equal to the length of the portion of defective material.

The first segment of high temperature superconducting wire can have a first resistance, the second segment of high temperature superconducting wire can have a second resistance, and the value of the second resistance can be less than the value of the first resistance.

In another aspect, the invention features a manufacture for conducting current. The manufacture includes a first segment of high temperature superconducting wire, a patch, and a lamination structure. The first segment of high temperature superconducting wire includes a defect. The patch includes a second segment of high temperature superconducting wire positioned to overlap the defect, and a bond layer provided between the first segment of high temperature superconducting wire and the second segment of high temperature superconducting wire. The bond layer establishes a path such that current flows through the second segment of high temperature superconducting wire. The lamination structure surrounds the first segment of high temperature superconducting wire and the patch.

Embodiments may include one or more of the following features. The first segment of high temperature superconducting wire may have a first resistance, the second segment of high temperature superconducting wire may have a second resistance, and the value of the second resistance may be less than the value of the first resistance. The bond layer may include low resistance solder.

The defect may have a first length, the second segment of high temperature superconducting wire may have a second length, and the second length may be greater than the first length. The second segment of high temperature superconducting wire may span the length of the defect. The defect may have a first length, the second segment of high temperature superconducting wire may have a second length, and the second length may be less than or equal to the first length. The lamination structure may be in electrical contact with the first and second segments of high temperature superconducting wire.

In another aspect, the invention features a manufacture for conducting current. The manufacture includes a first means for conducting current, the means including a defect, a means for patching the first means for conducting current, and a means for laminating the first means for conducting current and the means for patching the first means for conducting current.

Embodiments may include one or more of the following features. The means for patching the first means for conducting current can include a second means for conducting current positioned to overlap the defect and a means for bonding the first means for conducting current and the second means for conducting current. The means for bonding may establish a path such that current flows through the second means for conducting current and around the defect.

The first means for conducting current may have a first resistance, the second means for conducting current may have a second resistance and the value of the second resistance may be less than the value of the first resistance. The defect may have a first length, the second means for conducting current may have a second length, and the second length may be greater than the first length. The second means for conducting current may span the length of the defect.

Embodiments may include one or more of the following advantages:

Among other advantages, addressing defects in the HTS insert requires no cutting of laminated HTS wires. Therefore, no joining of laminated HTS wires is necessary. This results in a reduction of thickness in the HTS wire in the area of the addressed defect. Such a reduction in thickness causes the area of the addressed defect to be more flexible than the area of overlap created using conventional external splicing techniques. The rigidity imparted by conventional external splicing approaches can be problematic since the manufacture and use of HTS wire can subject the wire to a significant amount of bending. For example, when winding the wire onto a cylindrical surface, the rigidity at the area of overlap can result in the wire not conforming to the desired shape of the cylindrical surface at the area of overlap. The increased bend strain found in thicker external splices can damage the HTS wire.

The defects in the HTS insert are addressed before the HTS insert is laminated. This results in a continuously laminated HTS wire, without any sharp edges in the area of the defect.

Other features and advantages of the invention are apparent from the following description, and from the claims.

DESCRIPTION OF DRAWINGS

FIG. 5 shows the patched HTS insert of FIG. 4 with a laminate layer applied.

DESCRIPTION

Figure 1:
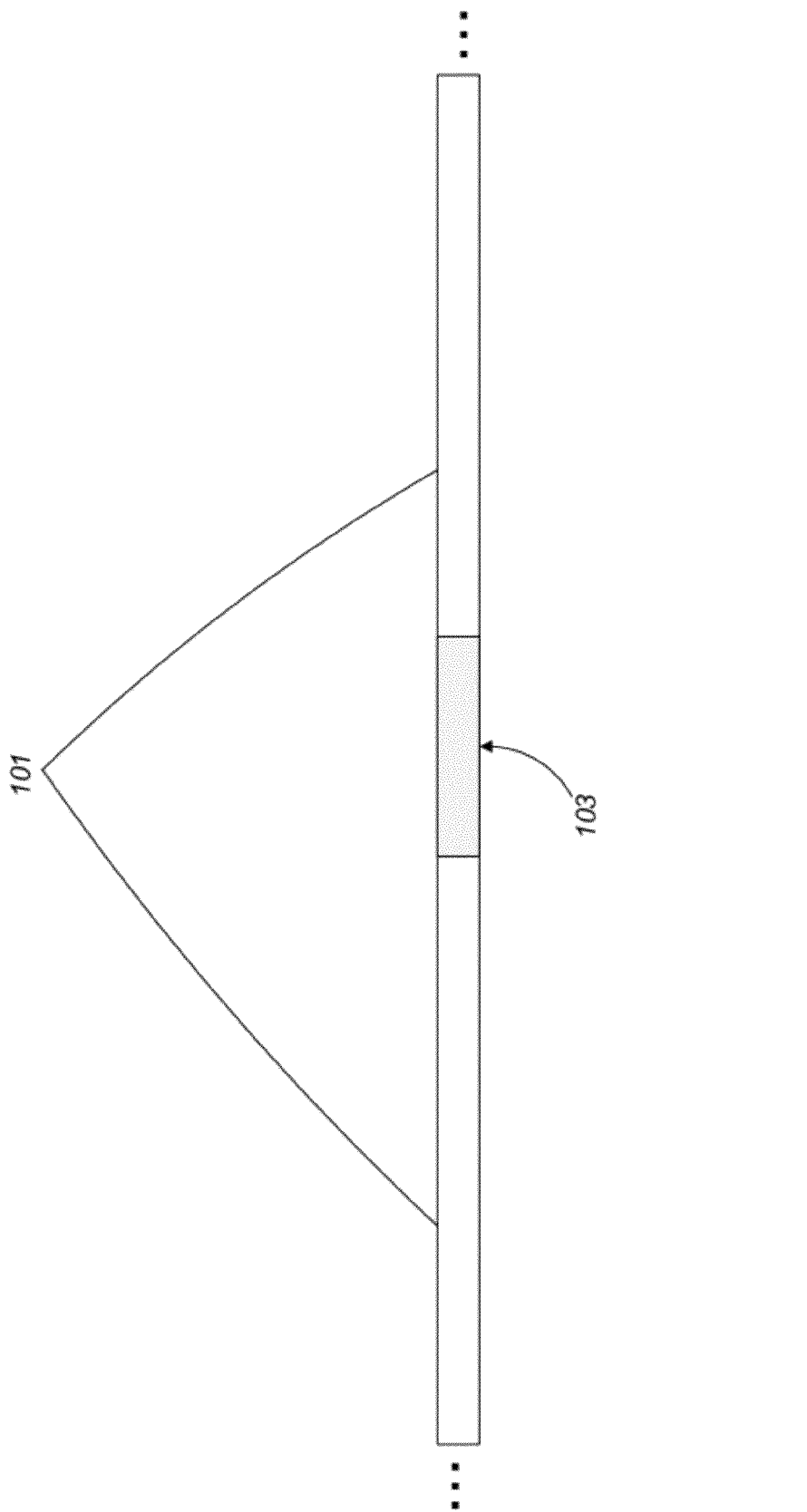
FIG. 1 shows a laminated HTS wire including a defect that has been addressed by patching.

Referring to FIG. 1, a length of laminated high temperature superconductor (HTS) wire 100 includes an HTS insert (shown in FIGS. 2-5) that is laminated with a lamination material as is described in later sections of this description. The laminated HTS wire 100 includes a segment 103 where a material defect in the HTS insert has been addressed by a patching method. The patched segment 103 that results from the patching method has a thickness that is less than the wire thickness that results from external splicing methods.

Figure 2:
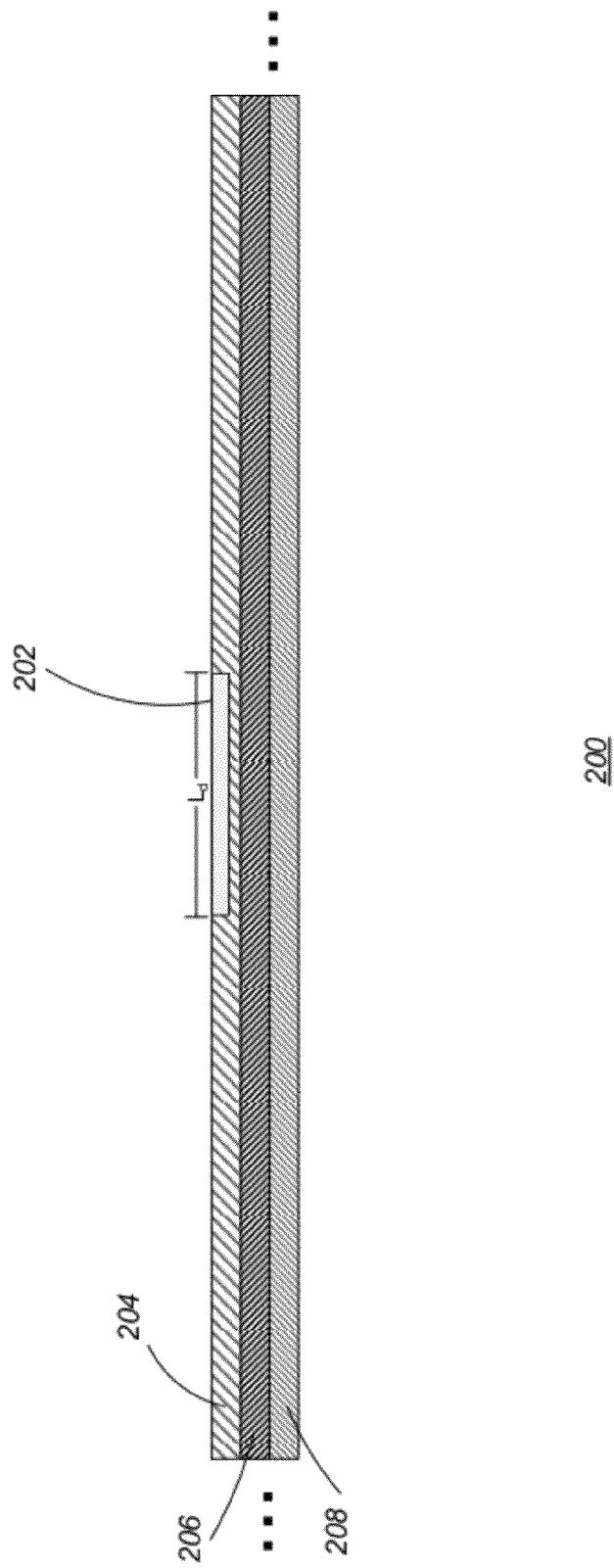
FIG. 2 shows a lengthwise cross section of an HTS insert that includes a defect.

FIG. 2 shows a lengthwise cross section of a primary HTS insert 200 including a material defect 202. The primary HTS insert 200, which runs through the entire length of the laminated HTS wire 100 includes a substrate layer 208, a buffer layer 206, and a superconducting layer 204. The superconducting layer 204 is typically made of a crystalline material such as polycrystalline rare-earth/alkaline-earth/metal oxide. For example, the material can be yttrium-barium-copper-oxide (YBCO).

The current-carrying capability of the superconducting layer 204 relies on the quality of the crystalline alignment of the superconducting material. A highly aligned superconducting layer 204 is created by first forming the buffer layer 206 on the substrate layer 208 such that the buffer layer's surface has a high degree of crystallographic texture. The superconducting layer 204 is then formed by growing a thin layer of superconducting material epitaxially on the buffer layer 206. The high degree of crystallographic texture of the buffer layer's surface imparts a high degree of crystalline alignment in the superconducting layer 204.

HTS inserts fabricated according to the previously described method are commonly referred to as second generation HTS inserts. For a more complete description of the fabrication process and the properties of second generation HTS inserts see Otto et al., US Patent Application Publication No. US 2009/0298696 A1.

As was previously mentioned, material defects 202 are inadvertently introduced into HTS inserts during the formation of HTS inserts and the fabrication of the HTS wires. Some common material defects are structural defects (e.g., fractures, dimples, etc) and crystallographic defects (e.g., poor crystallographic orientation in the superconducting layer 204). The physical dimensions of material defects 202 are constrained only by physical dimensions of the HTS insert.

In areas of the primary HTS insert 200 that are free of defects, current encounters little or no resistance as it flows along the superconducting layer 204. However, the presence of the material defect 202 imparts an undesirable increase in resistivity to the superconducting layer 204 in the area of the material defect 202. Such an increase in resistivity can result in an undesirable reduction in the current transmitted by the HTS wire 100.

One approach to avoiding such a reduction is to bypass the material defect 202 in the superconducting layer 204 of the primary HTS insert 200 before the primary HTS insert 200 is laminated and without cutting the primary HTS insert 200.

In the first step of the method, the material defect 202 in the primary HTS insert 200 is detected. For example, during the HTS insert fabrication process, the resistance of segments of the HTS insert is measured and segments that have a resistance greater than a predetermined value are marked as defective.

Figure 3:
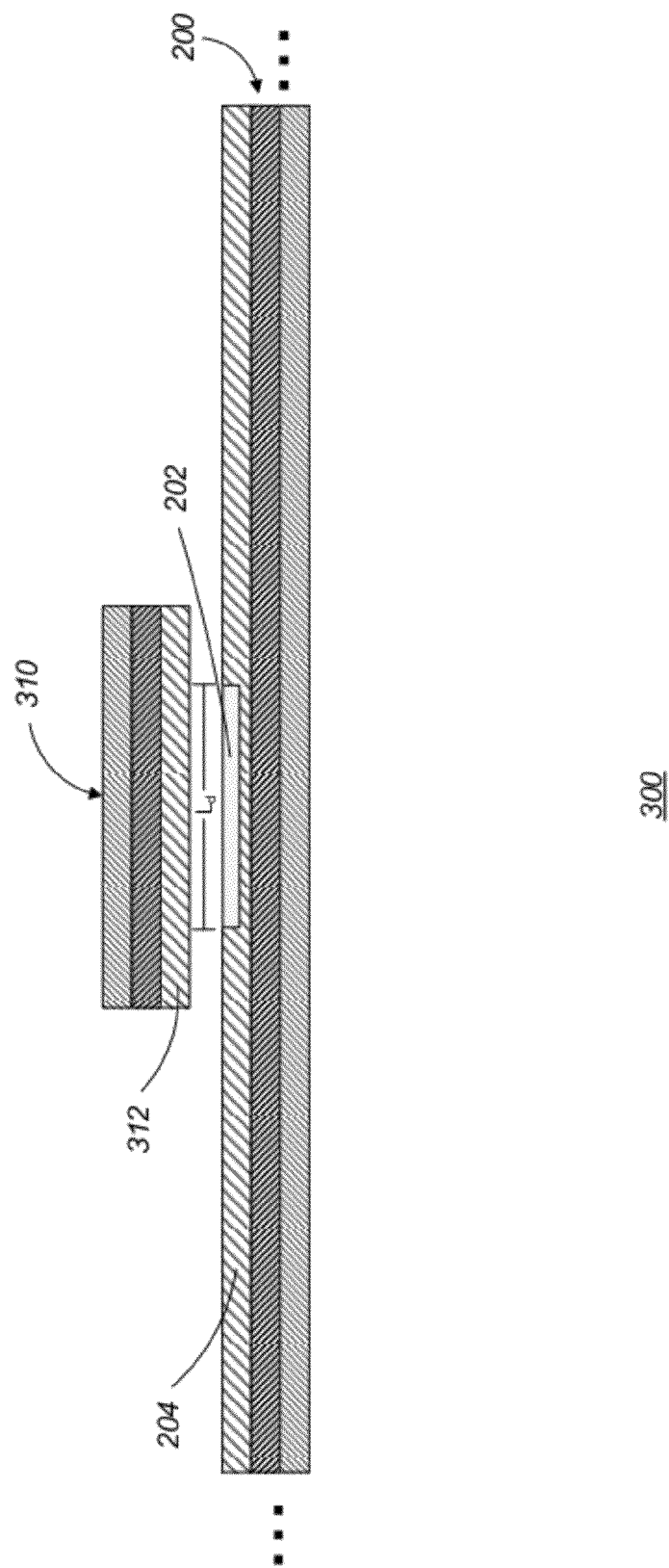
FIG. 3 shows the HTS insert of FIG. 1 with an HTS insert patch positioned over the defect.

FIG. 3 shows a lengthwise cross section of the primary HTS insert 200 and an HTS insert patch 310. In this example, the aforementioned defect detection process has located the material defect 202 on the primary HTS insert 200. The next step involves creating the HTS insert patch 310 and positioning the patch such that it overlaps the material defect 202.

In the present embodiment, the HTS insert patch 310 is formed of the same type of HTS insert as the primary HTS insert 200. The HTS insert patch 310 has a width that is equal to the width of the primary HTS insert 200 and a length that is greater than the length $L_d$ of the material defect 202.

The HTS insert patch 310 is then positioned such that it overlaps the material defect 202. Since the second generation HTS inserts used in the present embodiment are asymmetrical, the patch 310 is flipped over so that its superconducting layer 312 is opposite the superconducting layer 204 of the primary HTS insert 200. This orientation facilitates current flowing through the two superconducting layers 204, 312.

Figure 4:
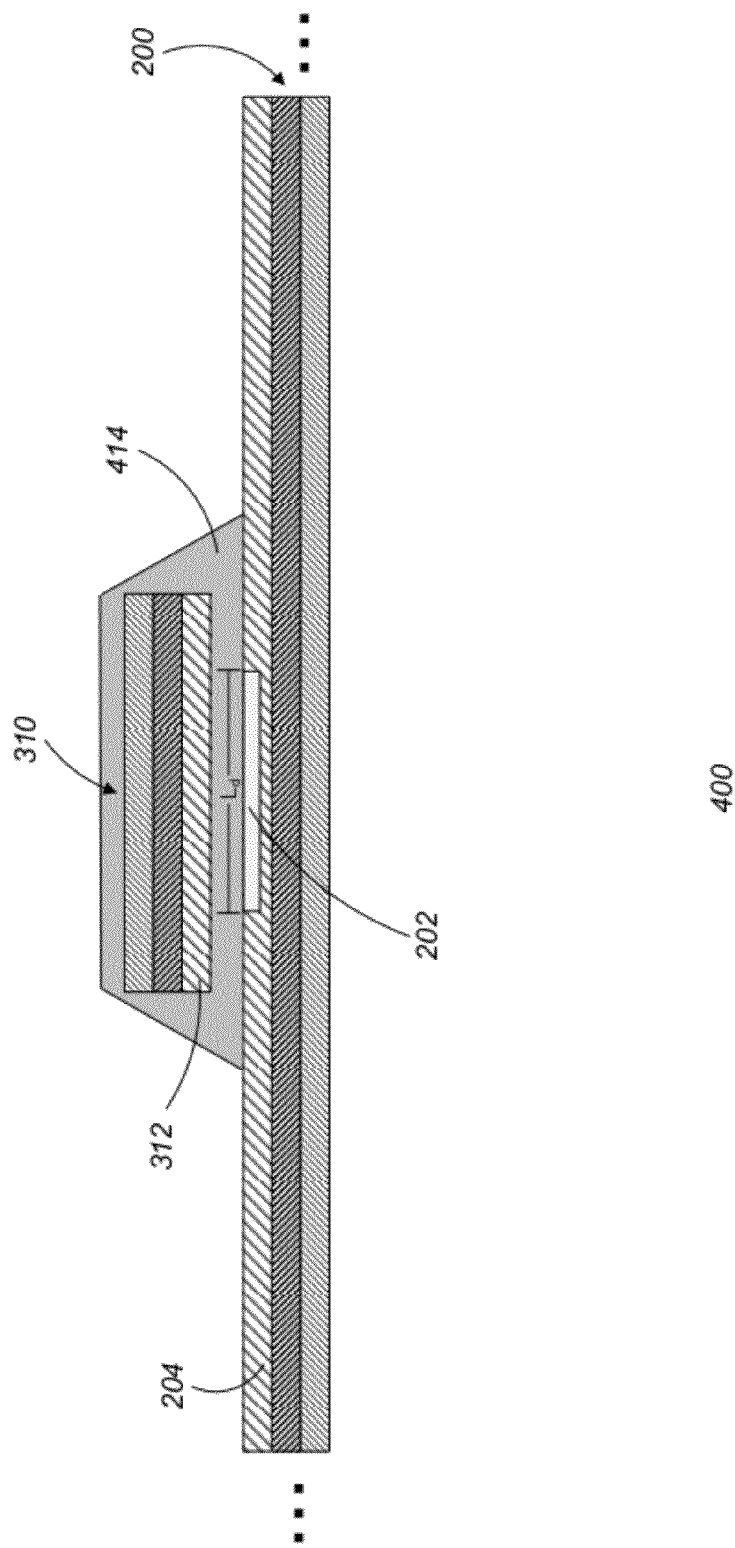
FIG. 4 shows a lengthwise cross section of the HTS insert and the HTS insert patch of FIG. 3 bonded to each other.

Referring to FIG. 4, a lengthwise cross section of an electrical connection between the primary HTS insert 200 and the HTS insert patch 310 is shown. A bonding process establishes an electrical connection between the superconducting layer 204 of the primary HTS insert 200 and the superconducting layer 312 of the HTS insert patch 310 such that current can flow freely between the two layers. In the present embodiment, the bonding process is a soldering process that deposits a layer of solder 414 over the HTS insert patch 310 and in the area between the HTS insert patch 310 and the primary HTS insert 200. The solder layer 414 can include any low resistance solder material, for example, indium, Pb—Sn, or Pb—Sn—Ag.

Establishing an electrical connection between the superconducting layer 312 of the HTS insert patch 310 and the superconducting layer 204 of the primary HTS insert creates a conductive path parallel to a path that contains the material defect 202. Depending on the relative resistance of the paths thus formed, the majority of the current flowing through the primary HTS insert 200 will be diverted into the HTS insert patch 310 in the area of the material defect 202. By creating a superconducting path around the segment of the primary HTS insert 200 including the material defect 202, one mitigates the resistive effects of the material defect 202 and the power losses associated with them.

FIG. 5 shows a, a lengthwise cross section of the finished HTS wire 500 that is created by depositing a laminating layer 516 onto the patched primary HTS insert 200. The lamination layer 516 surrounds the primary HTS insert 200 and the patched segment, including the bonded HTS insert patch 310. In the present embodiment, the lamination layer 516 is a conductive material such as stainless steel or brass. In the event of a fault in the superconducting wire 500, the conductive lamination layer 516 can continue to transmit power.

Alternatives

In the preceding description, the length of the HTS insert patch 310 was greater than the length $L_d$ of the material defect 202. However, in some examples, the length of the HTS insert patch 310 is equal to or lesser than the length $L_d$ of the material defect 202.

In the preceding description, the HTS insert patch 310 spans the length of the material defect 202. In other examples, the HTS insert patch 310 may only partially cover the material defect 202.

In the preceding description, the lamination material is electrically conductive. In other examples, the lamination material is electrically insulative.

In the preceding description, the HTS insert patching method is carried out prior to the lamination process. In other examples, a defect can be detected in an already laminated wire and the method can involve removing the lamination material in the area of the defect, patching the defect, and then re-laminating in the area of the patch.

In the preceding description, the HTS insert patch 310 has a width that is equal to the width of the material defect 202. In other examples, an HTS insert patch 310 with a smaller width can be used.

It is to be understood that the foregoing description is intended to illustrate and not to limit the scope of the invention, which is defined by the scope of the appended claims. Other embodiments are within the scope of the following claims.

What is claimed is:

1. A manufacture for conducting current, the manufacture comprising: a first segment of high temperature superconducting wire including a defect; a patch including: a second segment of high temperature superconducting wire positioned to overlap the defect; a bond layer provided between the first segment of high temperature superconducting wire and the second segment of high temperature superconducting wire; wherein the bond layer establishes a path such that current flows through the second segment of high temperature superconducting wire; and a lamination structure surrounding the first segment of high temperature superconducting wire and the patch.

2. The method of claim 1, wherein the first segment of high temperature superconducting wire has a first resistance, the second segment of high temperature superconducting wire has a second resistance, and the value of the second resistance is less than the value of the first resistance.

3. The manufacture of claim 1, wherein the bond layer includes low resistance solder.

4. The manufacture of claim 1, wherein the defect has a first length, the second segment of high temperature superconducting wire has a second length, and the second length is greater than the first length.

5. The manufacture of claim 4, wherein the second segment of high temperature superconducting wire spans the length of the defect.

6. The manufacture of claim 1, wherein the defect has a first length, the second segment of high temperature superconducting wire has a second length, and the second length is less than or equal to the first length.

7. The manufacture of claim 1, wherein the lamination structure is in electrical contact with the first and second segments of high temperature superconducting wire.

\* \* \* \* \*